US 9,222,974 B2

(12) United States Patent
Srinivasan et al.

(10) Patent No.: US 9,222,974 B2
(45) Date of Patent: Dec. 29, 2015

(54) SYSTEM AND METHOD FOR REDUCING VOLTAGE DROP DURING AUTOMATIC TESTING OF INTEGRATED CIRCUITS

(71) Applicant: STMicroelectronics International N.V., Amsterdam (NL)

(72) Inventors: V Srinivasan, Greater Noida (IN); Satinder Singh Malhi, Noida (IN); Tripti Gupta, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 31 days.

(21) Appl. No.: 14/152,879

(22) Filed: Jan. 10, 2014

(65) Prior Publication Data

US 2015/0198665 A1    Jul. 16, 2015

(51) Int. Cl.
    *G01R 31/3187*    (2006.01)
    *G01R 31/317*    (2006.01)
    *G01R 31/3185*    (2006.01)
    *G01R 31/40*    (2014.01)

(52) U.S. Cl.
    CPC .. *G01R 31/31727* (2013.01); *G01R 31/318552* (2013.01); *G01R 31/318594* (2013.01)

(58) Field of Classification Search
    CPC .............. G01R 31/318552; G01R 31/318594; G01R 31/318536; G01R 31/318541; G01R 31/318555; G01R 31/318385; G01R 31/318547; G01R 31/3187; G01R 31/3813; G01R 31/31701; G01R 31/31727
    See application file for complete search history.

(56) References Cited

U.S. PATENT DOCUMENTS

| | | | |
|---|---|---|---|
| 7,945,833 B1 * | 5/2011 | Wang et al. | 714/729 |
| 2005/0166104 A1 * | 7/2005 | Rich et al. | 714/724 |
| 2006/0282727 A1 * | 12/2006 | Hoshaku | 714/726 |
| 2009/0210763 A1 * | 8/2009 | Eckelman et al. | 714/731 |
| 2010/0213960 A1 * | 8/2010 | Mok et al. | 324/755 |
| 2011/0099442 A1 * | 4/2011 | Hales et al. | 714/729 |
| 2012/0030532 A1 * | 2/2012 | Jain et al. | 714/726 |

OTHER PUBLICATIONS

Debaleena Das, and Nur A. Touba, "Reducing Test Data Volume Using External/LBIST Hybrid Test Patterns", Proceedings International Test Conference 2000, IEEE; Oct. 3, 2000; Atlantic City, NJ; 8 pages.

* cited by examiner

*Primary Examiner* — April Y Blair
*Assistant Examiner* — Dipakkumar Gandhi
(74) *Attorney, Agent, or Firm* — Seed IP Law Group PLLC

(57) ABSTRACT

A system and method for testing an integrated circuit using methodologies to reduce voltage drop during ATPG and LBIST testing. In one embodiment, delay elements may be added to a clock circuit used to generate the various clock signals that trigger the switching of the various electronic components. In another embodiment, logic circuitry may be added to a clock generation circuit to isolate clock domains in order to enable a clock signal in each clock domain in a specific pattern. In yet another embodiment, capture phases for LBIST testing may be made to be asynchrounous within each capture phase, such that data capture for one LBIST partition may be timed different from other capture phases for other LBIST partitions. Finally, a further embodiment ATPG circuitry may also be partitioned such that logic circuitry only enables one (or less than all) ATPG partition at a time.

21 Claims, 5 Drawing Sheets

SYSTEM AND METHOD FOR REDUCING VOLTAGE DROP DURING AUTOMATIC TESTING OF INTEGRATED CIRCUITS

BACKGROUND

Integrated circuits are being produced in smaller and smaller form factors which is leading to a reduction of space available for various additional functionality in these integrated circuits. With reduced space for circuitry for such functionality, all aspects of integrated circuit technology is under pressure to perform faster and with more efficiency. One such area includes automated testing of integrated circuits using common approaches such internal Logic Built-In Self Test circuitry (LBIST) and external Automatic Test Pattern Generator (ATPG) methods.

As integrated circuits become smaller, fewer pins are available for input/output and power distribution. As is now common, a single integrated circuit chip may include only one or two pins suited for external connection to a power supply. Thus, the integrated circuit is designed to perform at optimum levels using the limited power pins. However, as integrated circuit chips are often tested while still in wafer form, Automatic Test Equipment (ATE) may be used to test circuit functionality at various stages of manufacture. A problem that arises with integrated circuits that are highly efficient with respect to distribution of power (e.g., only one or two power pins), is that during ATPG testing, the voltage distribution system in the individual integrated circuit is subject to voltage drops due to transients when various test patterns are clocked simultaneously. That is, with limited pins for power supply in conjunction with simultaneously clocking of internal test circuitry, transient currents drawn at the clock edges often lead to enough of a voltage drop on the power pins that cause erroneous results with regard to the testing. Such erroneous faults due to voltage drops from the testing itself defeat the purpose of integrated circuit testing.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a system and method for testing an integrated circuit using methodologies to reduce voltage drop during ATPG and LBIST testing. As briefly discussed in the background, simultaneous switching of circuits under test may lead to current spikes as several different electronic components are drawing current at the same time. This may lead to voltage drops on internal voltage supply lines that exceed acceptable thresholds. In order to alleviate these voltage drops, embodiments described herein seek to manipulate how and when the various electronic components are switched.

Thus, in one embodiment, delay elements may be added to a clock circuit used to generate the various clock signals that trigger the switching of the various electronic components such that not all electronic components switch at the same clock signal. In another embodiment, logic circuitry may be added to a clock generation circuit to isolate clock domains in order to enable a clock signal in each clock domain in a specific pattern that limits the number of electronic components being switched at any given time across the clock domains. In yet another embodiment, capture phases for LBIST testing may be made to be asynchrounous within each capture phase, such that data capture for one LBIST partition may be timed different from other capture phases for other LBIST partitions. Finally, a further embodiment ATPG circuitry may also be partitioned such that logic circuitry only enables one (or less than all) ATPG partition at a time. These solutions for reducing voltage drops on internal voltage supply lines of an integrated circuit under test may combined with one another in any manner so as to realize benefits from each embodiment as well. These aspects are described in greater detail below with respect to FIGS. 1-8.

Figure 1:
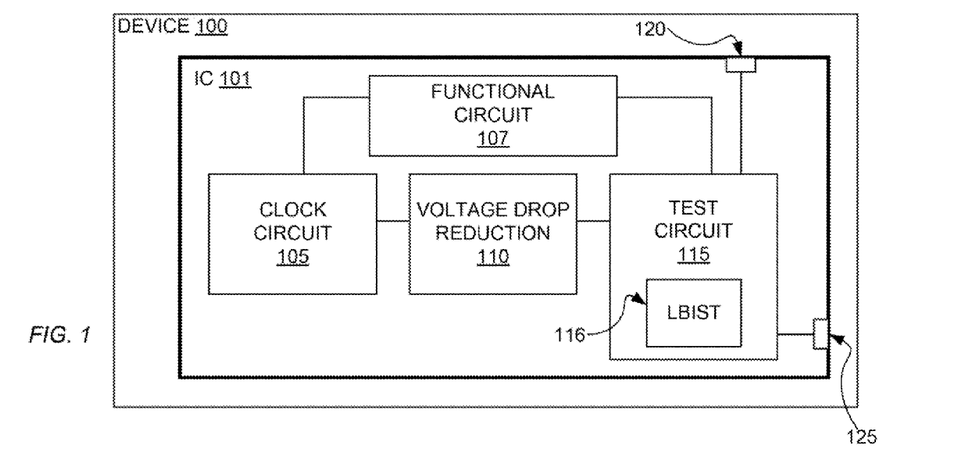
FIG. 1 is a block diagram of a device suited to be implemented in an integrated circuit according to an embodiment.

FIG. 1 is a block diagram of a device 100 suited to be implemented in an integrated circuit according to an embodiment. The device 100 may be suitably implemented in an integrated circuit 101 having one or more integrated circuit dies. Such integrated circuit dies are typically manufactured in wafers (not shown) and subsequently tested while still in the wafer form using a combination of external ATE (not shown) using ATPG as well as LBIST within each integrated circuit in the wafer as a system (described below with respect to FIG. 8).

The device 100 may include a clock circuit 105 configured to generate several different clock signals for use within the device 100. Such a clock circuit 105 provides one or more (often numerous) clock signals for triggering the operations of the device 100 both during test mode operation and normal mode operation (normal mode operation means when the circuitry is out of test mode operation and is operating in one of its intended operating modes). Thus, the clock circuit 105 is coupled to one or more functional circuits 107 for use in normal mode operation (this coupling is shown as through voltage drop reduction circuit 110 which is described in further detail below). Further, during test mode operation, the clock circuit 105 is coupled to a test circuit 115 (through voltage drop reduction circuit 110).

The test circuit 115 is also coupled to the functional circuit 107 such that during test mode operation, the functional circuit 107 and test circuit 115 are subjected to test signals designed to test the functionality of the functional circuit 107. Such testing may be accomplished using a LBIST circuit 116 within in the test circuit 115 as well as ATE (not shown) that may use an ATPG to send specific test signals via an ATPG input 120. Such test signals are designed to elicit specific output signals on the ATPG output 125. Further, signals from the LBIST 116 may also be read out at the ATPG output 125. Thus, the combination of LBIST signals and ATPG signals will generate numerous signals indicating the proper functioning (or lack thereof) of the functional circuit 107.

A skilled artisan understands that the block diagram of FIG. 1 is merely an illustration used to group various portions of various circuits into functional labels, as various components of each circuit may be coupled and interspersed in several different manners such that the "block" designation will not match with any physical area of a device. Rather, various components of each block may be physically located throughout the IC 101 and not necessarily in any manner of arrangement as shown in FIG. 1.

Before continuing, "shift mode" and "capture mode" of ATPG are briefly described. During shift mode, input test data is serially shifted into, and output test data is shifted out from, scan-chain registers through Scan In and Scan Out ports. Once ATPG mode entered, some device functional pins will be reconfigured as Scan In and Scan Out pins which will be used during shift mode. During capture mode, the input test data is shifted from the scan-chain registers to the circuitry under test, this circuitry operates at normal operating speed to manipulate the data and to generate output test data, and then this output test data is loaded into the scan-chain registers and shifted out to the ATE for analysis. For example, data may be typically shifted into all of the scan chains registers at 40 MHz, and during capture mode, the circuitry operates at 320 MHz/160 MHz/80 MHz to manipulate the input test data and to provide the output test data. More details of the shift and capture modes are described below.

During test mode operation, the clock circuit 105 generates clock signals to trigger various functions within the functional circuit 107 and the test circuit 115. Integrated circuits 101 often undergo a first set of tests while they are still part of a wafer, i.e., before they are diced from the wafer and packaged. Because there is always an increasing pressure to increase the throughput of this testing (e.g., the number of dies tested in a given unit of time), engineers are continually trying to increase the speeds at which this testing is performed.

One way to effectively increase the testing speed is to test as many integrated circuit dies as possible in parallel. But, commonly, a test head of the ATE only has a finite number of test probes. This means that the more integrated circuit dies that are tested simultaneously, the fewer pins of the test head that are available for each die. For example if an integrated circuit die has 128 digital pins used for test on a test head of ATE with 512 digital pins, then only 4 integrated circuit dies can be tested in parallel. But with optimum digital test pins selection for integrate circuit die having 32 pins, one can test 16 devices in parallel. Likewise, 16 digital test pins per integrated circuit, will yield 32 integrated circuit dies that may be tested in parallel.

Therefore, in test mode operation, each integrated circuit die is typically "assigned" one clock pin, minimal data input pins, and minimal data output pins. Further, integrated circuit dies may have only one or two power pins as more and more pins are used for functional applications. This is because power distribution can be managed by power bars when the integrated circuit die is packaged.

Unfortunately, with an integrated circuit die being assigned (or having) only one or two power pins, as power is distributed in such a limited manner prior to the benefit of such power bars being available (e.g., the integrated circuit dies in the wafer are not yet diced and packaged), significant transient voltage drops in the power-supply voltage may arise. For example, for a 1.2 V voltage supply, the transient voltage drop can be up to, or even greater than, 300 millivolts (mV) at one or more internal nodes. Such a transient voltage drop may cause the functional circuit 107 on the integrated circuit die 101 to operate improperly during the test mode operation, and thus may cause the integrated circuit die to fail a test when, in fact, the integrated circuit die has no defects.

The reason for such transient voltage drops is attributable to a trending reduction the number of external supply pins on a packaged integrated circuit. With a reduction in power pins, a power bar (not shown as it is typically part of an IC package) may be formed along the periphery of an integrated circuit die 101. A power bar is a wide trace of metal that typically surrounds the periphery of the integrated circuit die; therefore, the power bar provides a relatively low-resistance path for a supply current to propagate from the external supply pins to the internal supply nodes on the integrated circuit die. However, to reduce the footprint of integrated circuits, the power bar may be eliminated (e.g., provided as part of the package) to reduce the size of the die. Therefore, the number of power pins is typically not increased and the resistance of the path from the external power pins to the internal supply nodes on the die may be relatively high. Therefore, when test mode operation draws a relatively large current (e.g., 50 A-100 A), the resistance of this path can cause a significant voltage drop between the external supply pins and the internal supply nodes of the integrated circuit die 101 when still part of the wafer under test. This concept may be better understood with reference to FIG. 2 which is described next.

Figure 2:
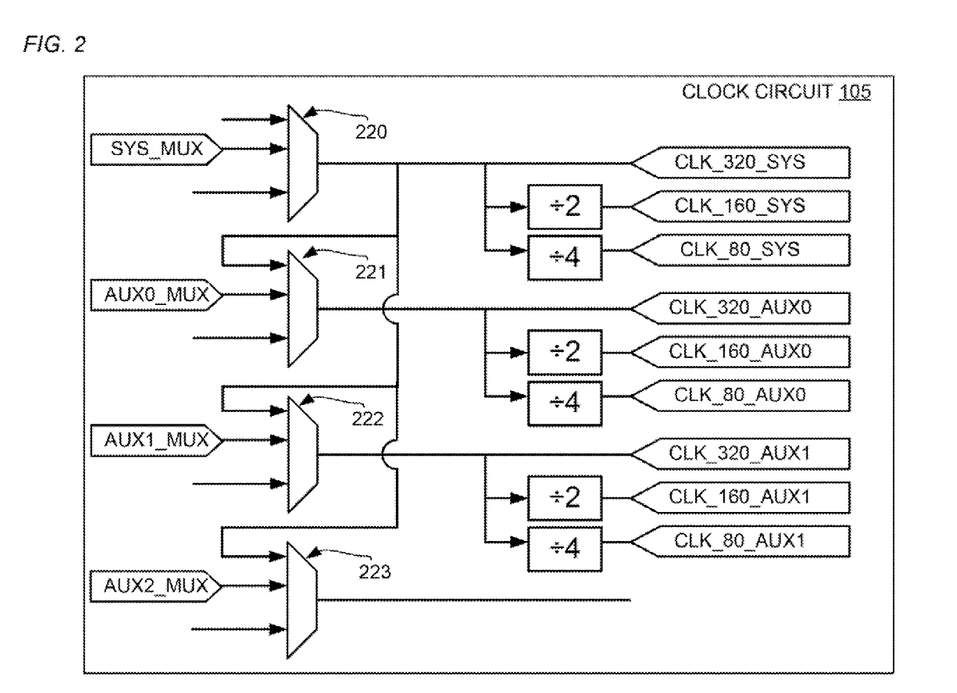
FIG. 2 is a diagram of a clock distribution circuit for an integrated circuit to be tested according to an embodiment.

FIG. 2 is a diagram of a clock distribution circuit 105 for an integrated circuit that may be under test according to an embodiment. The clock circuit 105 may typically include several clock signals that various functional circuits may use during normal operation of the integrated circuit. In the example embodiment of FIG. 2, there are four different clock signals shown, each with three different frequencies. A skilled artisan understands that more or fewer clocks may be used with more or fewer frequencies, but for the purposes of this example embodiment, the four clock signals shown are SYS, AUX0, AUX1, and AUX2 and the three frequencies shown are 320 MHz, 160 MHz, and 80 MHz.

Thus, as one can see in this example of FIG. 2, a first clock signal SYS_MUX may be one input to a first multiplexor 220. The multiplexor 220 also includes two other inputs which are not used during any test mode and will not be discussed further as the multiplexor 220 is set to only use the SYS_MUX signal input during test mode The multiplexor 220 output is then the SYS clock signal at 320 MHz (CLK_320_SYS). The CLK_320_SYS signal may be divided down by first and second dividers to respectively produce clocks signals at 160 MHz (CLK_160_SYS) and 80 MHz (CLK_80_SYS) as well.

Next, a second clock signal AUX0_MUX may be one input to a second multiplexor 221. This multiplexor 221 also includes two other inputs, one of which is coupled to the CLK_320_SYS signal. In the second clock signal AUX0 here, the multiplexor 221 is set during test mode to select the other input from the CLK_320_SYS signal. The multiplexor 221 output is then the AUX0 clock signal at 320 MHz (CLK_320_AUX0) but one understands that since the input at the second multiplexor 221 is set to the CLK_320_SYS signal, the CLK_320_AUX0 signal simply mirrors the CLK_320_SYS signal. As before, the CLK_320_AUX0 signal may be divided down by first and second dividers to respectively produce clocks signals at 160 MHz (CLK_160_AUX0) and 80 MHz (CLK_80_AUZ0) as well (but are again mirroring the SYS clock signals). These relationships hold true for the AUX1 clock signals too as the third multiplexor 222 produces a CLK_320_AUX1 signal that mirrors the CLK_320_SYS signal. Further, although not shown in detail, a fourth multiplexor 223 also produces a CLK_320_AUX2 signal that also mirrors the CLK_320_SYS signal. Thus, all produces clock signals, during a test mode of operation, are derivative from the SYS clock. This is beneficial as any ATE probe needs only commit one pin to a clock signal for testing.

Due to using the same clock signal for all operations in the test mode, the functional circuitry on the integrated circuit die may periodically draw high currents that cause the large transient drops in the internal supply voltages as described above because during data shift of a test mode, all of the shift registers, and all of the circuitry under test, are clocked by the same clock signal CLK_320_SYS. Similarly, during data capture of the test mode, all of the capture registers in a particular frequency group (e.g., 320 mhz_sys, 320 mhz_aux0, and 320 mhz_aux1 as an example) and all related circuitry under test are also clocked by the same clock signal CLK_320_SYS signal. Therefore, shift registers, capture registers, and related circuitry are all switched simultaneously, such that this simultaneous switching causes a large transient load current, which then leads to voltage drops at the power pin.

Of course, during normal operation of the integrated circuit die, not all circuits are switching at the same time (e.g., when CLK_320_SYS is switching, CLK_320_AUX0 and CLK_320_AUX1 are off, when CLK_320_AUX0 is switching, CLK_320_SYS and CLK_320_AUX1 are off, and when CLK_320_AUX1 is switching, CLK_320_SYS and CLK_320_AUX0 are off). Therefore, the magnitudes of current transients are much less and do not cause a voltage drop on the internal supply voltages such that circuit failure may occur. Further, normal mode operation occurs within a suitable voltage range provided by a voltage regulator circuit (not shown), but during test mode the voltage regulator circuit is bypassed in lieu of an external voltage. To further understand operations during test mode in conjunction the clock circuit 105, FIG. 3 shows the test circuit 115 of FIG. 1 in greater detail.

Figure 3:
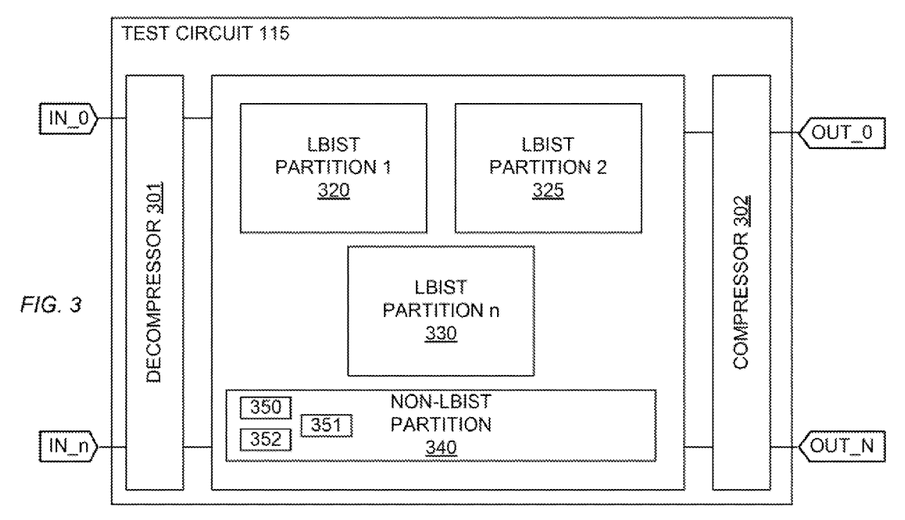
FIG. 3 is a diagram of an ATPG circuit in an integrated circuit to be tested according to an embodiment.

FIG. 3 is a diagram of an ATPG circuit 115 in an integrated circuit to be tested according to an embodiment. As discussed briefly above, the test circuit 115 includes logical groupings of circuitry located throughout the integrated circuit that may be used during ATPG test mode as well as during LBIST operations. Generally speaking, the test circuit 115 includes a number of scan chains in the context of ATPG, which are simply circuits designed to receive a known input signal at an input node in order to induce an expected output signal on an output node. The input nodes (n total input nodes) are shown on the left-hand side of FIG. 3 as IN_0 through IN_n. Similarly, the output nodes (n total output nodes) are shown on the right-hand side of FIG. 3 as OUT_0 through OUT_n. Further, these signals are also used in conjunction with partitions of the overall LBIST circuitry. In the example embodiment of FIG. 3, there are three LBIST partitions 320, 325, and 330 along with one non-LBIST partition 340.

Generally, ATPG testing (as compared to LBIST alone) allows for detection of more fault types, but is slower because all the test data needs to be scanned in and scanned out through integrated circuit die pads from/to pins. This is generally distinguished from LBIST circuitry that includes a generator for generating pseudorandom test patterns internally such that no input data needs to be scanned in; but output data is still scanned out from LBIST. The ATPG scan-chain circuitry includes a decompressor 301 for receiving each of the signals on each input node IN_0-IN_n, and coordinates a parallel communication of the signals to each scan chain in the ATPG scan chains. As is typical, there may be numerous scan chains in any given integrated circuit, e.g., 500-2000 different scan chains in a typical die, more in larger dies such as for microprocessors. The decompressor 301 generates from this input test data a respective test pattern (sometimes called a test vector) for each ATPG scan chain, and provides these test patterns to the ATPG scan chains. The decompressor 301 is typically hardware that converts the input test data into these predetermined test patterns that are designed to indicate if functional circuitry is malfunctioning, and, if it is malfunctioning, how it is malfunctioning. For example, such a test pattern may allow detection and identification of a "stuck on" fault in which an internal node is held at a fixed voltage level due to, e.g., a short circuit.

Each of the scan chains is a series of scan chain registers that serially shift test-pattern data from the decompressor 301 to a compressor 302. The compressor 302 receives the output data from the scan chains and compresses it down into fewer bits to generate the output test data, and then provides this output test data, via the outputs node OUT_0-OUT_n to the ATE for analysis. The compressor is also typically hardware The LBIST circuitry is dedicated test logic on the integrated circuit die that generates its own pseudo-random patterns (PRPG), provides these patterns to the circuitry under test, and includes multiple input signature registers (MISRs) that receive data output by the circuitry under test. The data in the MISRs may be analyzed by the LBIST circuitry, and the result of this analysis scanned out, or the data in the MISRs may be scanned out directly and analyzed externally to the integrated circuit die. So, the LBIST circuitry typically does not require any input test data to be scanned in, but does require that the output test data from the MISRs be scanned out either directly or indirectly. Therefore, the MISRs may be coupled to their own scan chain(s) for scan out, or may be coupled to one or more of the ATPG scan chains for scan out.

Furthermore, the LBIST circuitry is typically partitioned such that each partition tests a certain region of the integrated circuit die. These partitions may be based on normal-operation criteria that is independent of the LBIST circuitry itself. That is, the partitions may already exist for other reasons, and separate LBIST circuitry is provided for each partition. Examples of partitions include partitions between regions of the integrated circuit die that operate on different internal supply voltages, operate at different clock frequencies, or are different types of circuitry (e.g., analog or digital, memory or logic, etc.).

Figure 4:
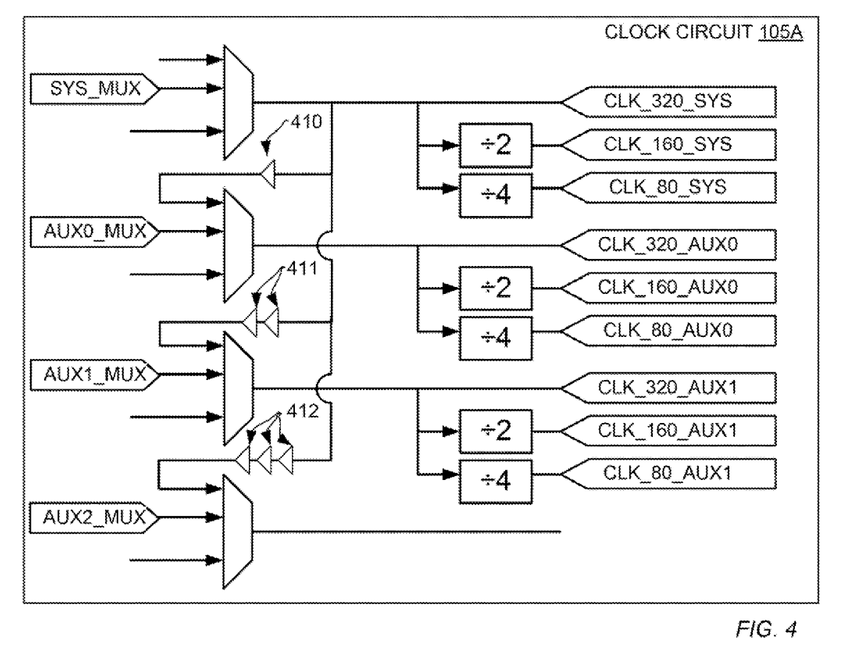
FIG. 4 is a diagram of clock distribution circuit having delay addition shift methodology according to an embodiment.

FIG. 4 is a diagram of clock distribution circuit 105A having a delay addition shift methodology for reducing voltage drops according to an embodiment. Most aspects of this clock circuit 105A are similar to the clock circuit 105 of FIG. 2, however, the cascading feed of the initial SYS clock signal includes one or more delay elements 410, 411, and 412. As described above, in conventional ATPG scanning, test data is scanned into and/or out of all scan chains simultaneously using the same clock (CLK_320_SYS). In the embodiment of FIG. 4, a different delay is added to the clock for each scan chain or group of scan chains. Thus, any scan chain triggered from the CLK_320_AUX0 clock signal will have a delay equivalent to one delay element 410. Similarly, any scan chain triggered from the CLK_320_AUX1 clock signal will have a delay equivalent to two delay elements 411. Likewise, any scan chain triggered from the CLK_320_AUX2 clock signal will have a delay equivalent to three delay elements 412. This means that the clock edge for each scan chain or group of scan chains will be slightly delayed/skewed with respect to the clock edges for the other scan chains or scan-chain groups. So instead of one large current spike (resulting in voltage drops) at the same clock edge, more, smaller current spikes occur that yield smaller sustainable voltage drops. That is, this delay technique effectively spreads out the current draw, thus reducing the voltage drops at any one time, so that the maximum voltage drops, and thus the maximum drop on any internal supply node, is below a threshold set to insure that the circuitry will not malfunction due to an internal supply voltage that is too low. For example, if there are three scan chains, instead of a single current spike of I every period of the clock cycle, there may be 3 current spikes of ⅓ every period of the clock cycle, where these spikes are spread out from one another in time.

Figure 5:
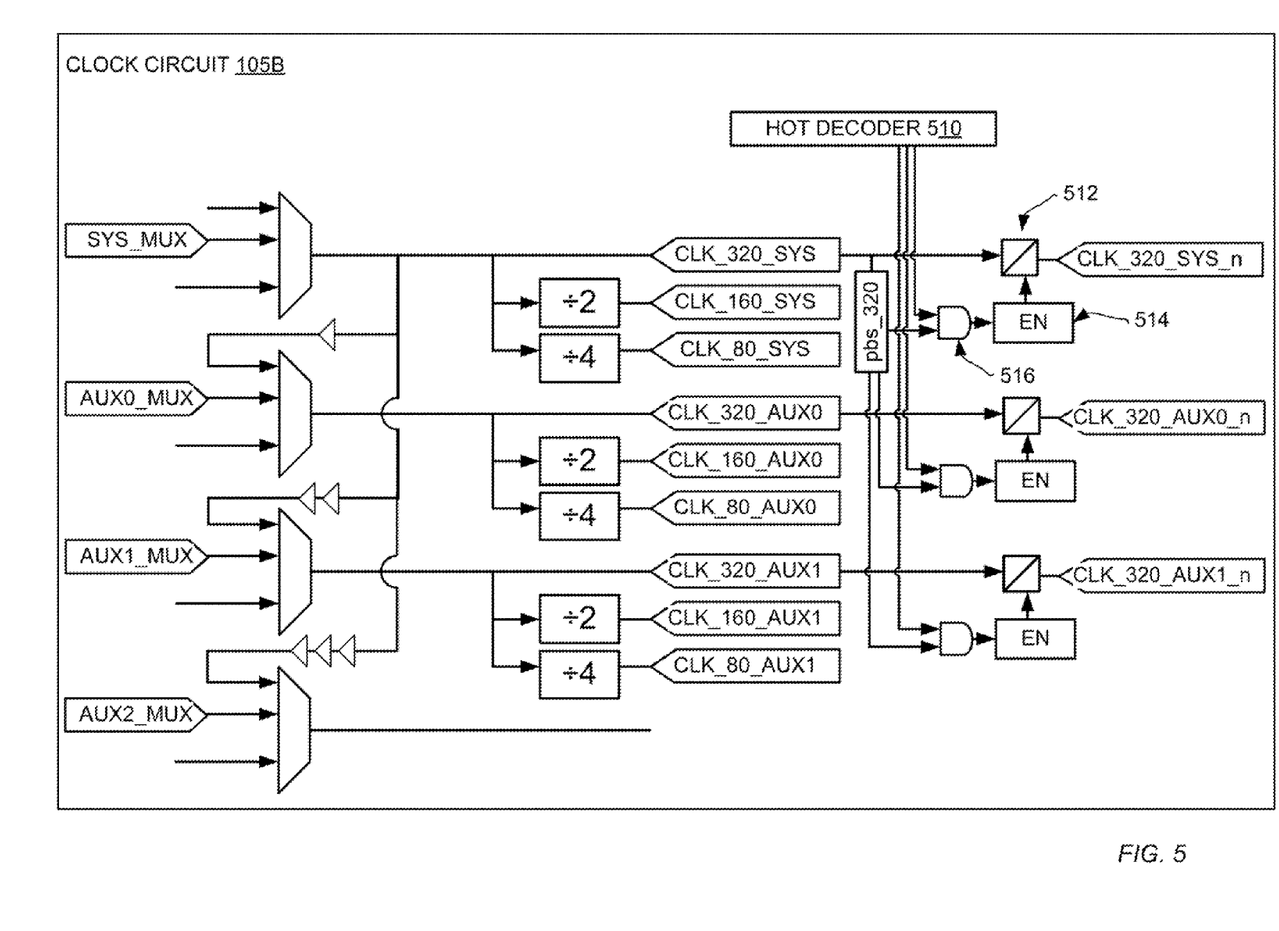
FIG. 5 is a diagram of clock distribution circuit having domain based clock switching methodology according to an embodiment.

FIG. 5 is a diagram of clock distribution circuit 105B having domain based clock switching methodology according to an embodiment. Again, several aspects of this clock circuit 105B are similar to the clock circuit 105 of FIG. 2, however, this clock circuit includes a hot decoder 410 for assisting with reduction of voltage drops during ATPG capture. One can see that the clock circuit 105B also includes the delay addition elements as described above with respect to FIG. 4, but a skilled artisan understands that these elements may not be part of this embodiment or may be used in conjunction with the hot decoder of this embodiment. For the remainder of the discussion of FIG. 5, only the hot decoder 410 aspects of voltage drop reduction are discussed.

In this embodiment, the clock circuit 105B is divided into different clock domains that may be isolated and enabled independent of each other by the hot decoder 410. For example, in the embodiment of FIG. 5, three clock domains are shown corresponding to CLK_320_SYS, CLK_320_AUX0, and CLK_320_AUX1. Each of these clock signals CLK_320_SYS, CLK_320_AUX0, and CLK_320_AUX1, are generated as described above with respect to FIG. 2, but prior to being used to trigger any ATPG scan or LBIST circuit, a gated logical circuit is used to only enable each domain clock signal CLK_320_SYS_n, CLK_320_AUX0_n, CLK_320_AUX1_n according to an enabling code from the hot decoder 510. The gated logical circuit includes an AND gate 516, an enable block 514, and a clock gate 512.

The AND gate 516 includes two inputs. A first input is coupled to the hot decoder 510 and the second input is coupled to a clock buffer flip-flop PBS_320 that passes the clock signal CLK_320_SYS on rising edges. Thus, the AND gate 516 will pass a logic one when the clock buffer flip-flop PBS_320 passes the clock signal CLK_320_SYS on rising edges along with a logic one from the hot decoder. Thus, the clock signal CLK_320_SYS, will only pass through if the hot decoder 510 enables the gated logic circuit via the AND gate 516. That is, when a logic one is on the second input from the hot decoder 510, the enable block 514 and switch 512 allow a gated clock signal CLK_320_SYS_n to be generated. Then, this clock domain CLK_320_SYS_n is enabled.

In this manner, the hot decoder 510 may step through a series of binary codes (corresponding to a plurality of flip-flops (not shown individually) which are sometimes called hot flops) for enabling each clock domain in a specific pattern. Thus, at a first time the hot decoder 510 may a flop value of '100' such that during capture, the CLK_320_SYS domain is enabled. Thus, CLK_320_SYS will reach CLK_320_SYS_n, but CLK_320_AUX0 and CLK_320_AUX1 will be blocked and so CLK_320_AUX0_n and CLK_320_AUX1_n will be disabled. Similarly if '010' then CLK_320_AUX0 propagates to CLK_320_AUX0_n, but CLK_320_SYS and CLK_320_AUX1 are blocked and CLK_320_SYS_n and CLK_320_AUX1_n remain disabled. Further, if '001' then CLK_320_AUX1 is allowed to generate CLK_320_AUX1_n, but CLK_320_SYS_n and CLK_320_AUX0_n remain disabled. The binary codes here are merely one example as a skilled artisan understands that the various clock domains may enabled and disabled in any suitable manner or pattern including multiple domains during the same flop. For example, a different clock domain enabling scheme may disable one clock domain at a time while all other clock domains remain active, as removing the cumulative effects of one clock domain may be enough in some systems to alleviate enough voltage drop during scanning.

The hot decoder 510 flops hold their values during a capture phase and may change only during a shift phase. In a typical scan chain, the ATE controls the hot decoder (or alternatively the hot decoder can be built in design) such that for whatever values loaded, only one output is enabled. That is, if four clock domains are used, two flops could be used to convey a two-bit binary control code such that if "00" is the binary control code, then CLK_320_SYS_n may be enabled and others disabled. Similarly if "01" is the binary control code, then CLK_320_AUX0 may be enabled and others disabled. In any scheme, scan capture is allowed in only one clock domain at a time. This reduces the current draw, and thus the voltage supply drop by spreading out the current draw during ATPG capture. Although this may lengthen the testing period because each clock domain is tested individually and not simultaneously in parallel, the amount of time added due to additional ATPG patterns is negligible. This is especially so considering that if the voltage drop is too high, the circuitry may yield incorrect test results in the first place. Further, the addition of the gating logic 512, 514, and 516 and hot decoder 510 adds minimal circuitry to the integrated circuit die.

Figure 6:
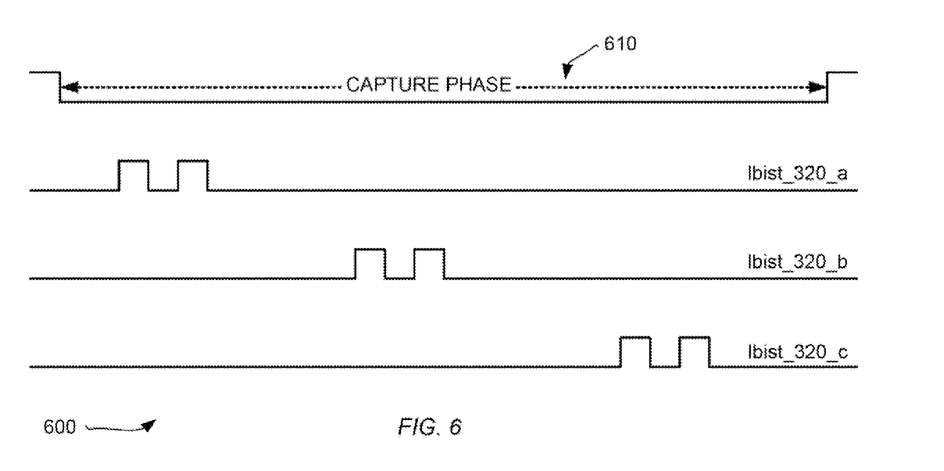
FIG. 6 is a timing diagram of an LBIST capture waveform showing a non-synchronous LBIST capture methodology according to an embodiment.

FIG. 6 is a timing diagram 600 of an LBIST capture waveform showing a non-synchronous LBIST capture methodology according to an embodiment. Another methodology presented here for reducing voltage drop during ATPG scan capture is to further divide the LBIST circuitry of the integrated circuit die into partitions. Referring back to FIG. 3, the LBIST circuitry is conceptually divided into three partitions as shown, LBIST partition 1 320, LBIST partition 2 325, and LBIST partition n 330. Further, additional non-LBIST circuitry is grouped as a non-LBIST partition 340. As previously described, without partitioning LBIST circuitry, the circuit may experience a voltage drop on internal voltage supply nodes as each node in the LBIST circuitry is switched in parallel. That is, all electronic components will be triggered by the same clock signal during LBIST and/or ATPG scan and capture. Therefore, current spikes may cause detrimental voltage drops on the internal voltage supply nodes.

By partitioning the LBIST circuitry, one or more LBIST controllers 350, 351, and 352 may be used to coordinate the scanning of each of the LBIST partitions, 320, 325, and 330, respectively. In this example, the three LBIST partitions 320, 325, and 330, may be tested in parallel with each partition having its capture phase shifted with respect to other capture phases. A capture clock signal from a respective LBIST controller arrives at a different time with respect to other LBIST partitions. This is done by defining the capture clock signals accordingly within a capture period. Thus, one can see in the timing diagram of FIG. 6, that during a capture phase 610, the scan of a first partition LBIST 320_1 may be shifted during an early portion of the capture phase 610. Further, the scan of another partition LBIST 320_n may be shifted during a middle portion of the capture phase. Further yet, the scan of another partition LBIST 320_1 may be shifted during a later portion of the capture phase 610.

This methodology reduces the current draw, and thus voltage supply drops, by spreading out the current draw during LBIST capture. This may lengthen the overall testing period because the same clock domain of different LBIST partitions is captured serially (not simultaneously in parallel). However, the amount of time added to the LBIST capture period is negligible, particularly considering that if the voltage drops are too high, the circuitry may yield incorrect test results. Also, the addition of the logic needed to activate the domain clock in this manner adds minimal circuitry to the integrated circuit die. The timing diagram of FIG. 6 shows two clock cycles/edges per LBIST capture for each partition, but any number of cycles may be used during each LBIST capture segment.

Figure 7:
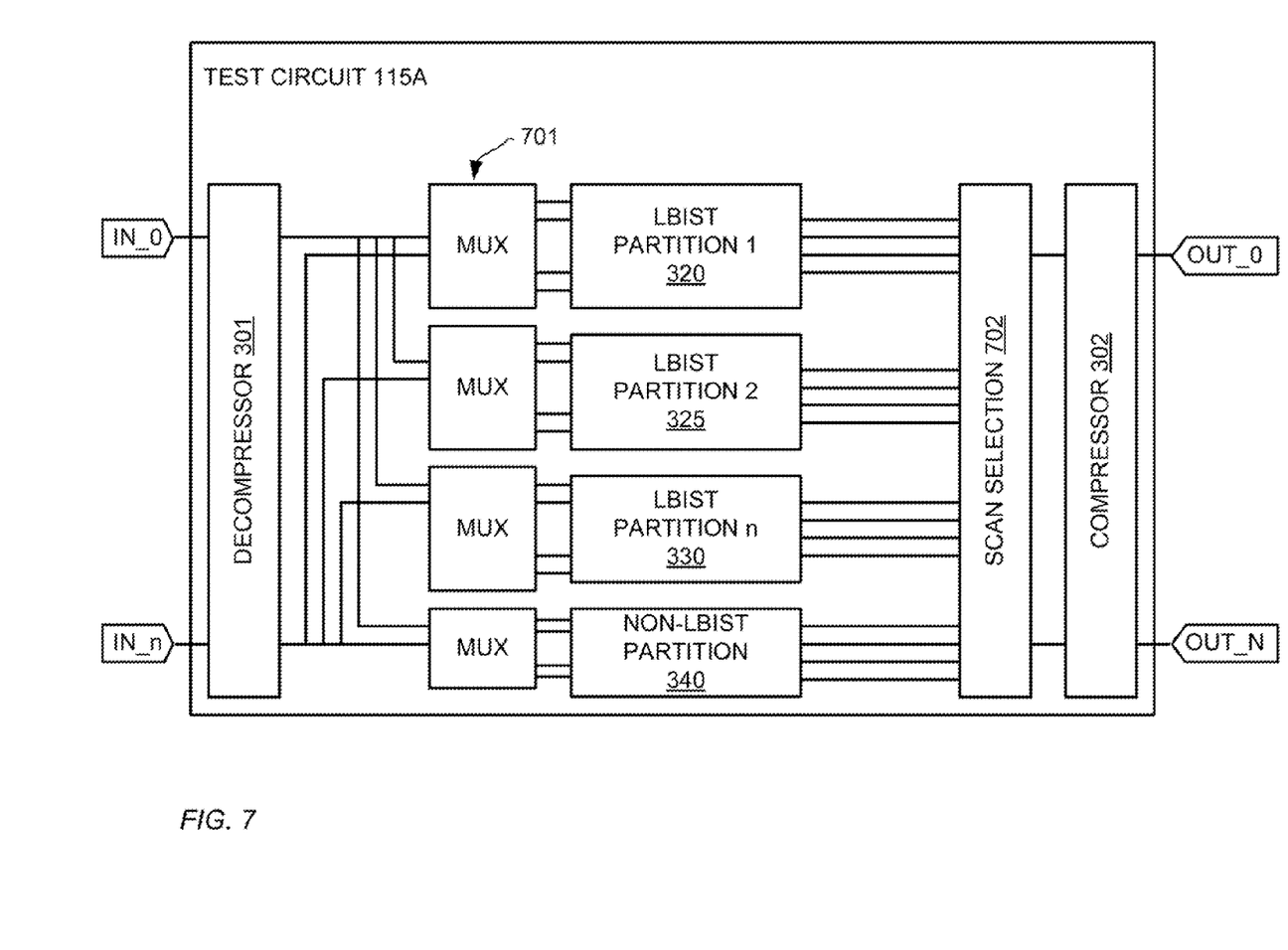
FIG. 7 is a diagram of ATPG circuit having a partition-based shift and capture methodology according to an embodiment.

FIG. 7 is a diagram of ATPG circuit 115A having a partition-based shift and capture methodology according to an embodiment. In yet another methodology for reducing voltage drops due to current spikes during ATPG and LBIST procedures, the ATPG circuitry under test may be logically divided into partitions. For example, the same partitions as the LBIST circuitry as shown in FIG. 3 (if a partition includes both LBIST tested circuitry and ATPG tested circuitry), or separate ATPG partitions may be formed. That is, if there is ATPG tested circuitry in integrated circuit die areas that are not part of an LBIST partition, then these areas can be grouped into ATPG partitions. With ATPG logical partitions, during ATPG shift and capture modes, only circuitry in one ATPG partition (or a group of more than one but fewer than all ATPG partitions) is activated at any one time. Thus, by spreading out circuits into partitions that have variable times for scan and capture, current spikes and voltage drops are alleviated.

To accomplish partitioning at the ATPG circuit level, a set of initial multiplexors 701 may be used to allow a specific pattern of data input to be shifted in from the decompressor 301. As the shifted data propagates through the selected partition or partitions, a scan selection circuit receives the expected partition or partition scan chain and subsequently passes the scan chain to the compressor 302. In this manner, the ATE may specifically set an order or scheme for testing that tests less than all partitions in parallel or even one partition at a time in a serial manner. This partitioning adds minimal circuit overhead because typically at least the LBIST partitions are already formed for reasons other than the ATPG test. Further, even if such ATPG partitions are not already formed, it is minimal circuit overhead to form them for ATPG testing. Furthermore, the extra time required for testing partitions serially rather than in parallel is minimal as described above.

Further, for each ATPG scan chain that is not in an active partition, the unselected scan chain can be logically emulated temporally with a single flip flop so that the ATE doesn't detect an error because no data is being shifted out from unselected scan chains. In one embodiment, using a single flip flop per scan chain instead of just keeping the scan chain active saves all power that would be otherwise used to switch several flip-flops in the scan chain.

Figure 8:
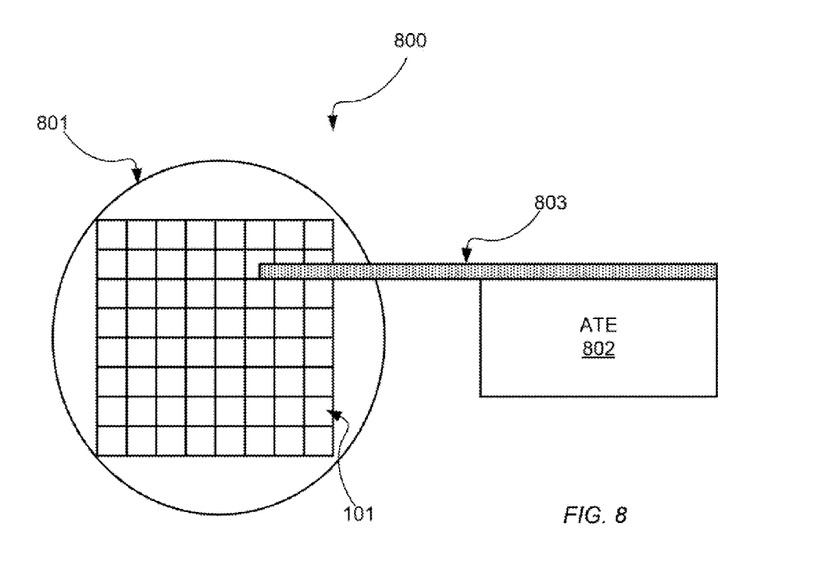
FIG. 8 is a diagram of system suited to implement testing any one of the circuits of FIGS. 1-7 according to an embodiment.

FIG. 8 is a diagram of system 800 suited to implement testing any one of the circuits of FIGS. 1-7 according to an embodiment. In this system 800, a wafer 801 under test may include several integrated circuit dies 101 that have yet to be diced into individual dies. Hence, a wafer 801 of integrated circuit dies 101 is shown. An ATE 802 having a test probe 803 is shown as engaging the wafer 801 under test. As described above, the test probe may include a number of different pins designed to engage pads of each integrated circuit die such that signals may be passed to (shifted) and received from (scanned) each integrated circuit die 101. In this manner the ATPG test may be accomplished using one or more of the various methodologies described above.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A device, comprising:
   a test circuit having a plurality of switchable components and including a plurality of LBIST partitions;
   a clock circuit coupled to the test circuit and configured to switch the plurality of switchable components; and
   a voltage-drop reduction circuit coupled to the test circuit and coupled to the clock circuit and configured to adjust the switching of the plurality of switchable components, the voltage-drop reduction circuit including a respective LBIST controller coupled to each of the plurality of LBIST partitions each LBIST controller configured to respectively asynchronously switch each of the plurality of LBIST partitions.

2. The device of claim 1, wherein the voltage-drop reduction circuit comprises a plurality of delay elements configured to provide delay to clock signals from the clock circuit.

3. The device of claim 2, wherein the clock circuit is configured to generate a plurality of clock signals such that the plurality of delay elements are configured to provide a different delay to each of the plurality of clock signals.

4. The device of claim 3, wherein the plurality of delay elements further comprises:
   a first delay element configured to provide a first delay to a first clock signal of the plurality of clock signals;
   a second delay element configured to provide a second delay to a second clock signal of the plurality of clock signals; and
   a third delay element configured to provide a third delay to a third clock signal of the plurality of clock signals.

5. The device of claim 1, wherein the clock circuit is further configured to generate a plurality of clock signals; and
   wherein the voltage-drop reduction circuit comprises:
      a plurality of logic circuits corresponding respectively to the plurality of generated clock signals; and
      a selector configured to enable one of the plurality of clock signals through its respective logic circuit.

6. The device of claim 1, wherein the clock circuit is further configured to generate a plurality of clock signals; and
   wherein the voltage-drop reduction circuit comprises:
      a plurality of logic circuits corresponding respectively to the plurality of generated clock signals; and a selector configured to disable one of the plurality of clock signals through its respective logic circuit.

7. The device of claim 1, wherein the clock circuit is further configured to generate a plurality of clock signals; and
wherein the voltage-drop reduction circuit comprises:
a plurality of logic circuits corresponding respectively to the plurality of generated clock signals; and
a selector configured to enable one of the plurality of clock signals through its respective logic circuit while disabling each of the other of the plurality of clock signals via respective logic circuits.

8. The device of claim 1, wherein the test circuit further comprises a plurality of ATPG partitions; and
wherein the voltage-drop reduction circuit comprises:
a plurality of multiplexors, each one of the plurality of mulitplexors corresponding uniquely with one of the plurality of ATPG partitions;
a selector circuit coupled to each of the plurality of ATPG partitions and configured to enable ATPG partitions; and
a controller configured to control each of the plurality of multiplexors and the selector such that less than all of the ATPG partitions are enabled during a scan.

9. The device of claim 8, wherein the test circuit further comprises dummy flip flops configured to emulate ATPG partitions that are not enabled by the voltage-drop reduction circuit.

10. The device of claim 1, further comprising:
a plurality of scan inputs configured to be engaged by automatic testing equipment such that test data may be shifted into the device;
a decompressor coupled to the plurality of scan inputs and configured to shift the test data into a plurality of scan registers;
a compressor coupled to the plurality of scan registers and configured to shift data out of the scan registers after a test period; and
a plurality of scan outputs coupled to the compressor and configured to provide data shifted out of the scan registers to the automatic test equipment.

11. A system, comprising:
automatic test equipment having a probe configured to engage an integrated circuit for testing;
a wafer of integrated circuit dies, each integrated circuit die having an integrated circuit, including:
a test circuit having a plurality of switchable components, the test circuit including a plurality of LBIST partitions;
a clock circuit coupled to the test circuit and configured to switch the plurality of switchable components; and
a voltage-drop reduction circuit coupled to the test circuit and coupled to the clock circuit and configured to adjust the switching of the plurality of switchable components, and the voltage-drop reduction circuit including a respective LBIST controller coupled to each of the plurality of LBIST partitions, the LBIST controllers configured to collectively control the plurality of LBIST partitions to reduce unwanted drops in a voltage being supplied to the integrated circuit being tested.

12. The system of claim 11, wherein the voltage-drop reduction circuit comprises a plurality of delay elements configured to provide delay to clock signals from the clock circuit.

13. The system of claim 11, wherein clock circuit is further configured to generate a plurality of clock signals; and
wherein the voltage-drop reduction circuit comprises:
a plurality of logic circuits corresponding respectively to the plurality of generated clock signals; and
a selector configured to enable one of the plurality of clock signals through its respective logic circuit.

14. The system of claim 11, wherein the test circuit comprises a plurality of LBIST partitions; and
wherein the voltage-drop reduction circuit comprises a respective LBIST controller coupled to each of the plurality of LBIST partitions and each LBIST controller configured to respectively asynchronously switch each of the plurality of LBIST partitions.

15. The system of claim 11, wherein the test circuit comprises a plurality of ATPG partitions; and
wherein the voltage-drop reduction circuit comprises:
a plurality of multiplexors, each one of the plurality of mulitplexors corresponding uniquely with one of the plurality of ATPG partitions;
a selector circuit coupled to each of the plurality of ATPG partitions and configured to enable ATPG partitions; and
a controller configured to control each of the plurality of multiplexors and the selector such that less than all of the ATPG partitions are enabled during a scan.

16. A method for testing a circuit, comprising:
generating test pattern data having portions, the test pattern data configured to test a plurality of electronic components in the circuit, the electronic components including a plurality of LBIST partitions;
shifting the test pattern data into a test circuit that is part of the circuit under test;
desynchronizing the shifting of the test pattern data portions;
wherein the desynchronizing the shifting of the test data portions includes asynchronously shifting test data portions into the plurality of LBIST partitions.

17. The method of claim 16, wherein the desynchronizing further comprises passing portions of the test pattern data through differing delay elements.

18. The method of claim 16, wherein the desynchronizing further comprises:
generating a plurality of clock signals; and
enabling one of the plurality of clock signals through a respective logic circuit.

19. The method of claim 16, wherein the desynchronizing further comprises:
generating a plurality of clock signals; and
enabling less than all of the plurality of clock signals through a respective logic circuit.

20. The method of claim 16, wherein the desynchronizing further comprises:
generating a plurality of LBIST clock signals corresponding uniquely to one of the test pattern data portions; and
shifting each of the LBIST clock signals within a capture phase such that each of the LBIST clock signals does not coincide with any other LBIST clock signal.

21. The method of claim 16, wherein the desynchronizing further comprises:
passing each of the portions of test pattern data though a plurality of multiplexors corresponding uniquely to a plurality of ATPG partitions; and
enabling less than all of the portions of test pattern data via a selection through the plurality of multiplexors.

* * * * *